(12) United States Patent
Lim et al.

(10) Patent No.: US 7,008,734 B2
(45) Date of Patent: Mar. 7, 2006

(54) PHASE SHIFT MASK

(75) Inventors: Chang Moon Lim, Icheon-si (KR); Seo Min Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 196 days.

(21) Appl. No.: 10/608,412

(22) Filed: Jun. 30, 2003

(65) Prior Publication Data

US 2004/0110071 A1      Jun. 10, 2004

(30) Foreign Application Priority Data

Jul. 18, 2002    (KR) .................. 10-2002-0042031

(51) Int. Cl.
*G03F 9/00*     (2006.01)
(52) U.S. Cl. ...................................................... 430/5
(58) Field of Classification Search .................... 430/5
See application file for complete search history.

(56) References Cited

U.S. PATENT DOCUMENTS 5,795,682 A * 8/1998 Garza ............................ 430/5

* cited by examiner

*Primary Examiner*—Christopher G. Young
(74) *Attorney, Agent, or Firm*—Heller Ehrman LLP

(57) ABSTRACT

A phase shift mask, comprising a transparent substrate having a trench-type guard ring pattern for shifting the phase of light transmitted therethrough by 180°; and a half-tone phase shift pattern disposed on the transparent substrate and surrounded by the guard ring pattern is disclosed.

3 Claims, 6 Drawing Sheets

PHASE SHIFT MASK

BACKGROUND OF THE INVENTION

1. Field of the Invention

The present invention generally relates to a phase shift mask, and more specifically to a tri-tone phase shift mask comprising a quartz substrate region, a phase shift region having a transparency of 100% and a half-tone phase shift region.

2. Description of the Prior Art

Various types of phase shift masks are used to improve the limit in resolution in a lithography process of fabricating process of semiconductor devices.

In the lithography process, an image is obtained by interference of a light of zero order and a light of first order. A diffracted light is a plane wave which does not contain any information on a mask. A pattern on the mask is transferred to a wafer by interference of two diffracted lights.

Here, an image contrast is a ratio of intensities of the light of zero order to that of the light of first order. When the intensities of two diffracted lights are analogous, complete interference occurs and the image contrast is at its maximum value of 1. The intensity of the light of zero order is the average amplitude of the entire lights.

While all of the light of zero order can be transmitted through a lens, the light of first order has a small effective transmission ratio into the lens. As a result, the image contrast is less than 1, and decreases as the size of the patterns is decreased.

The amount of captured light of first order by the lens is determined by a simple geometry, and related to a repetition cycle of the pattern and an illumination method of a system. A rim-type phase shift mask or a half-tone phase shift mask which employs a method wherein the amount of the light of first order is increased and the amount of light of zero order is decreased has been used.

FIG. 1 is a cross-sectional diagram illustrating a rim-type phase shift mask.

Referring to FIG. 1, the rim-type phase shift mask comprises a quartz substrate 11 which includes a trench-type guard ring pattern 13 having a 180° phase shift, and a chrome layer 15 surrounded by the guard ring pattern 13. The chrome layer 15 is disposed on a predetermined region of the quartz substrate 11 where a light-shielding pattern is to be formed.

FIG. 2 is a cross-sectional diagram illustrating a half-tone phase shift mask.

Referring to FIG. 2, the half-tone phase shift mask comprising the quartz substrate 11 and a half-tone phase shift pattern 17 disposed on the quartz substrate 11 restricts the intensity of the light of zero order to improve the image contrast.

FIG. 3a is a graph illustrating the distribution of the intensity of a light of zero order and a light of first order of a BIM (Binary Intensity Mask). FIG. 3b is a graph illustrating the distribution of the intensity of a light of zero order and a light of first order of a half-tone phase shift mask having 6% transparency. FIG. 3c is a graph illustrating the intensity distribution of a light of zero order and a light of first order of a half-tone phase shift mask having 18% transparency.

As shown in FIGS. 3a through 3c, as the transparency of the half-tone phase shift mask is increased, the intensity of the light of zero order is decreased, and the intensity of the light of first order is increased.

The intensity of the light of zero order can be decreased as the transparency of the half-tone phase shift mask is increased. However, since the amount of a transmitted light is large, diffractions and interferences occur in a high density pattern region and desired patterns are formed while it is difficult to form a pattern in a low density pattern region due to direct transmission of the light.

SUMMARY OF THE INVENTION

It is an object of the present invention to provide a phase shift mask comprising a quartz substrate region, a phase shift region of 100% transparency and a half-tone phase shift region for high image contrast and improved resolution.

In order to achieve the object of the present invention, a phase shift mask comprising a transparent substrate having a trench-type guard ring pattern for shifting the phase of light transmitted therethrough by 180°; and a half-tone phase shift pattern disposed on the transparent substrate and surrounded by the guard ring pattern is provided.

DETAILED DESCRIPTION OF THE PREFERRED EMBODIMENTS

The present invention will be described in detail referring to the accompanying drawings.

Figure 1:
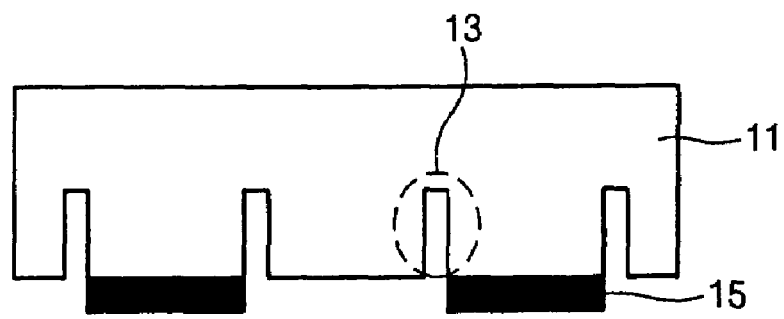
FIG. 1 is a cross-sectional diagram illustrating a rim-type phase shift mask.
Figure 2:
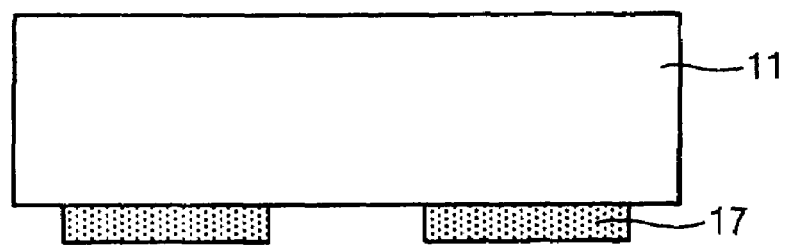
FIG. 2 is a cross-sectional diagram illustrating a half-tone phase shift mask.
Figure 3A:
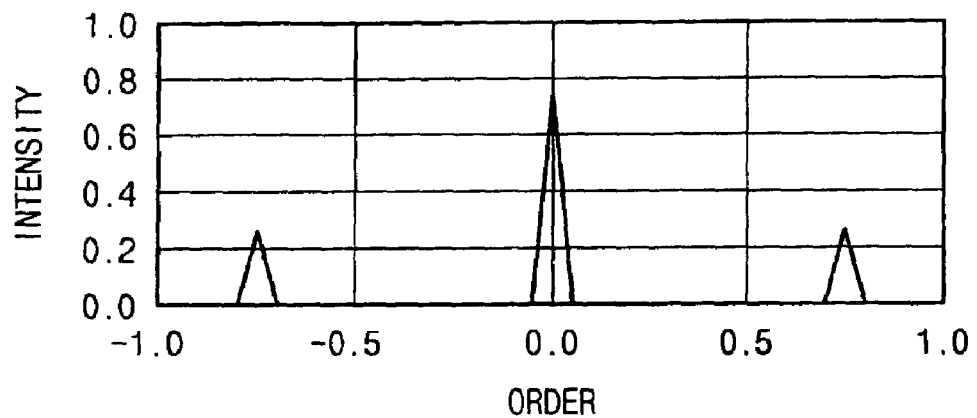
FIG. 3a is a graph illustrating the distribution of the intensity of a light of zero order and a light of first order of a BIM (Binary Intensity Mask).
Figure 3B:
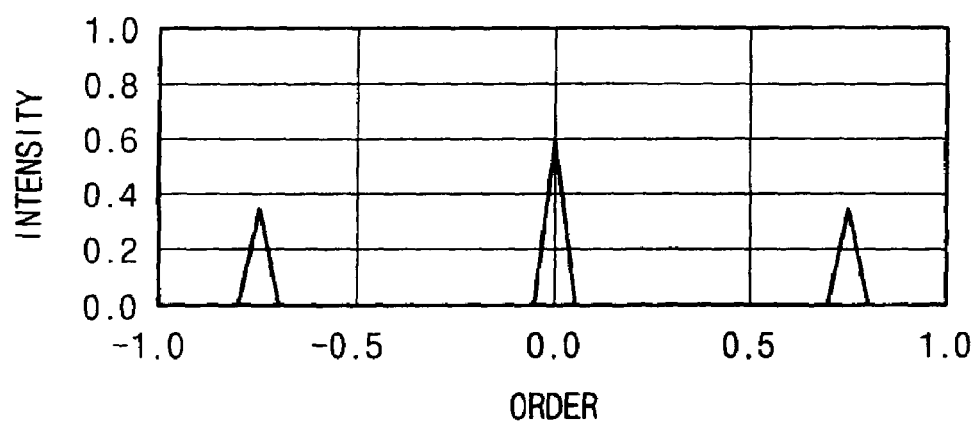
FIG. 3b is a graph illustrating the distribution of the intensity of a light of zero order and a light of first order of a half-tone phase shift mask having 6% transparency.
Figure 3C:
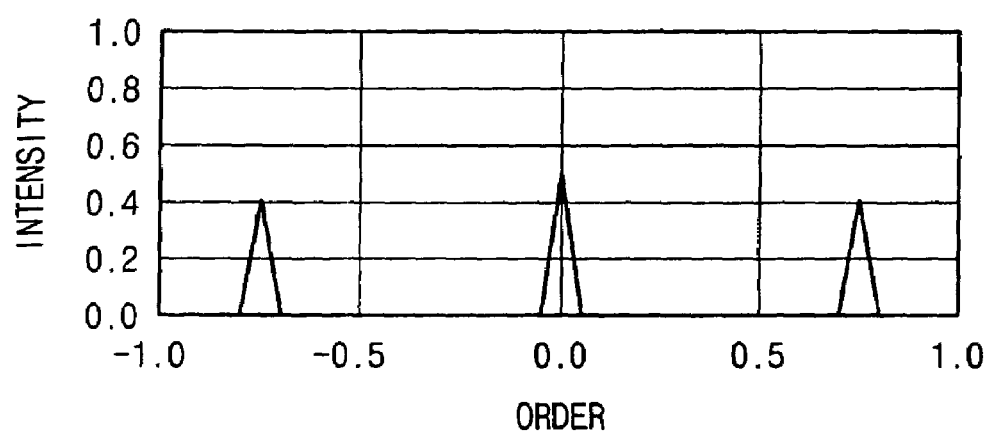
FIG. 3c is a graph illustrating the intensity distribution of a light of zero order and a light of first order of a half-tone phase shift mask having 18% transparency.
Figure 4:
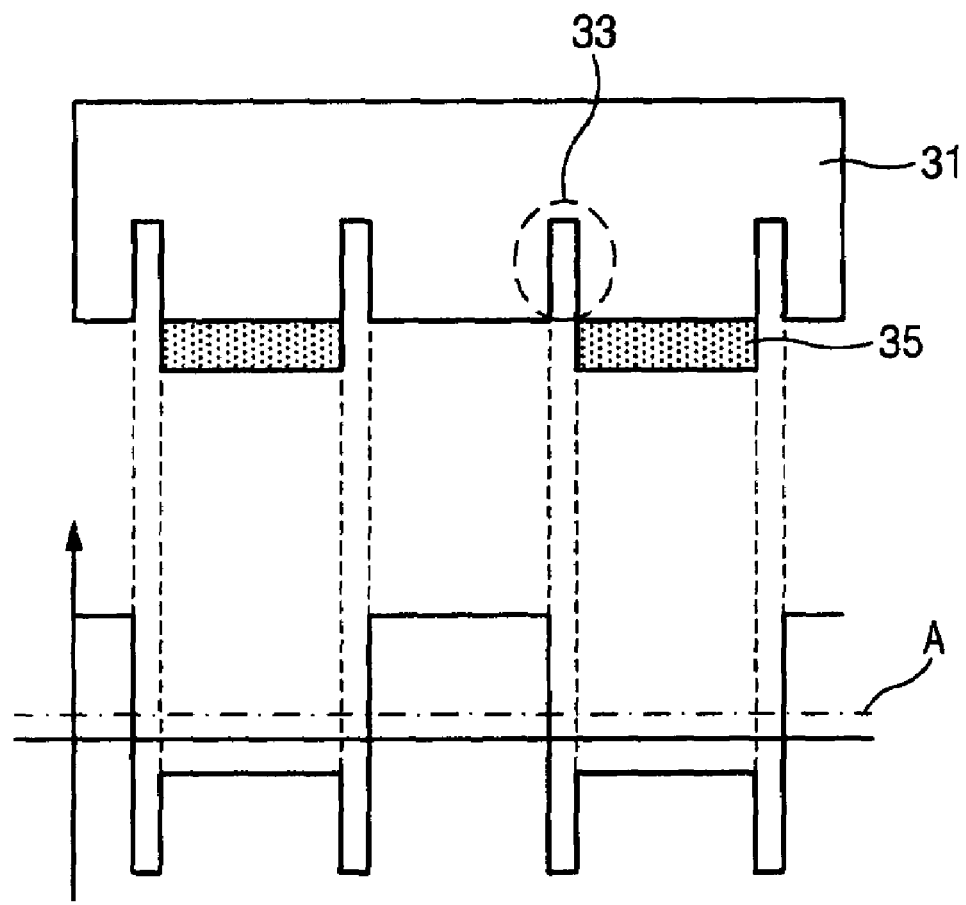
FIG. 4 is a diagram illustrating a phase shift mask and the amplitude of light at the mask according to a preferred embodiment of the present invention.

FIG. 4 is a diagram illustrating a phase shift mask and the amplitude of light at the mask according to a preferred embodiment of the present invention.

Referring to FIG. 4, a phase shift mask according to a preferred embodiment of the present invention comprises a quartz substrate 31 having a trench-type guard ring pattern 33 for shifting the phase of transmitted light by 180°, a half-tone phase shift pattern 35 disposed on the quartz substrate 31 to be surrounded by the guard ring pattern 33.

The quartz substrate 31 and the guard ring pattern 33 have transparency of 100%, respectively. Preferably, the transparency of the half-tone phase shift pattern ranges from 0 to 25%, and the half-tone phase shift pattern shifts the phase of transmitted light by 0° or 180°.

A ratio of the area of the guard ring pattern 33 and the half-tone phase shift pattern 35 or the shape of the guard ring pattern 33 and the half-tone phase shift pattern 35 may be changed to improve lithography process.

A tri-tone phase shift mask according to the present invention characterizes in that a rim-type phase shift mask comprising the guard ring pattern 33 having a phase shift of 180° disposed on the quartz substrate 31 is added to a half-tone phase shift mask comprising the half-tone phase shift pattern 35 disposed on the quartz substrate 31. The intensity of the light of zero order is restricted to improve the image contrast.

The tri-tone phase shift mask of the present invention may be used in an exposure process wherein off-axis illumination is performed and is not limited by the shape of the illumination. Any light sources may be used such as I line (365 nm), KrF (248 nm), Arf (193 nm) and $F_2$ (157 nm).

Figure 5:
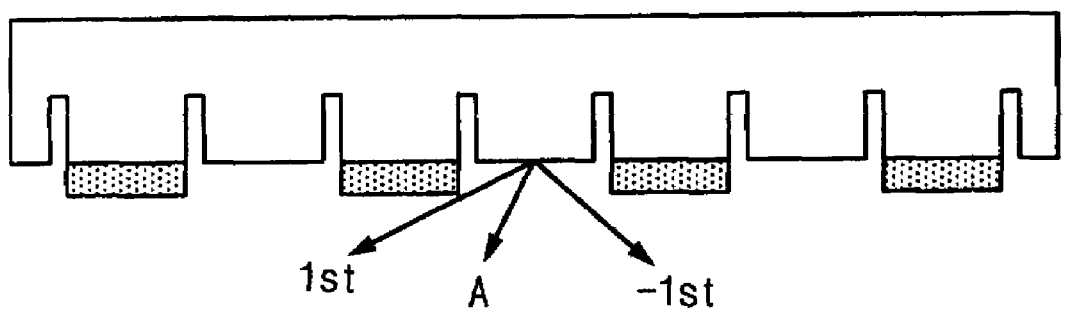
FIG. 5 is a diagram illustrating diffraction of light in a tri-tone phase shift mask according to the present invention.

FIG. 5 is a diagram illustrating diffraction of light in a tri-tone phase shift mask according to the present invention.

As shown in FIG. 5, according to the tri-tone phase shift mask of the present invention, the intensity of the light A of zero order is restricted, and the intensity of the light of first order is increased. AS a result, the high image contrast can be obtained due to decrease of the light A of zero order in spite of loss of the light of first order resulting from microscopic patterns.

Figure 6:
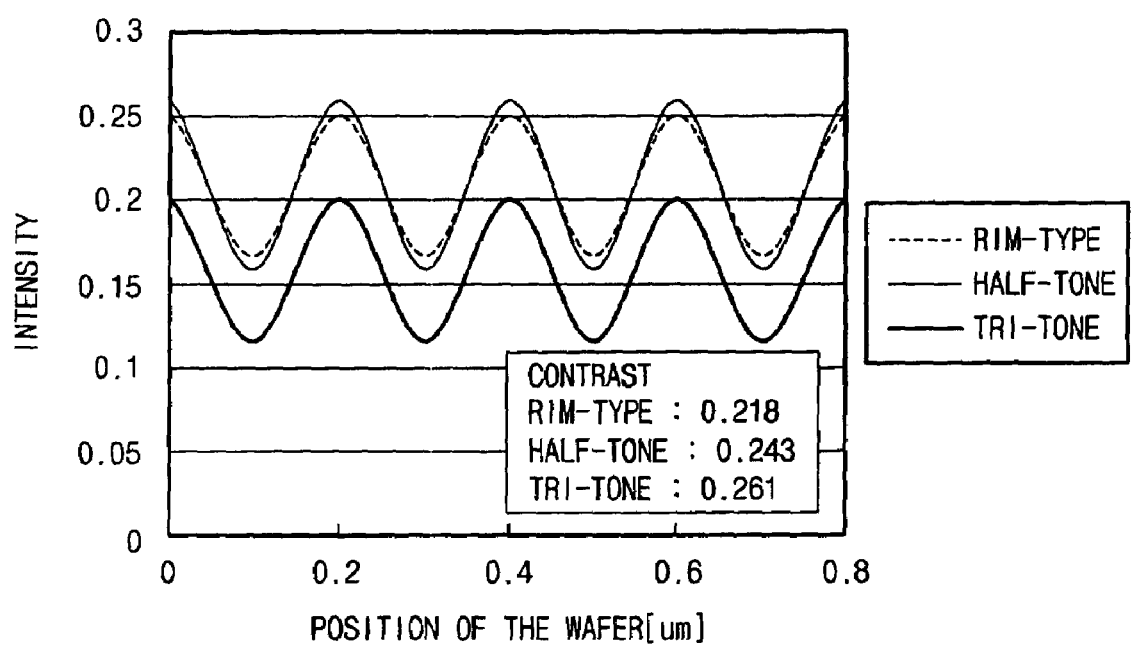
FIG. 6 is a graph illustrating the intensities of light at the tri-tone phase shift mask according to the present invention, a conventional rim-type phase shift mask, and the conventional half-tone phase shift mask.

FIG. 6 is a graph illustrating the intensities of light at the tri-tone phase shift mask according to the present invention, a conventional rim-type phase shift mask, and the conventional half-tone phase shift mask.

[Equation]

$$I_{max} - I_{min} \div I_{max} + I_{min} (I_{max}: \text{maximum strength of light}, I_{min}: \text{minimum strength of light})$$

Referring to FIG. 6 where the image contrast of a line/space pattern of 100 nm using KrF (248 nm) is simulated, as a result of calculation using the above equation, the tri-tone phase shift mask of the present invention has a light intensity of 0.261, the conventional rim-type phase shift mask has a light intensity of 0.218, and the conventional half-tone phase shift mask has a light intensity of 0.243. It should be noted that the tri-tone phase shift mask of the present invention provides high image contrast.

As described above, the phase shift mask of the present invention is a tri-tone phase shift mask comprising a quartz substrate region, a phase shift region having a transparency of 100%, and a half-tone phase shift region. The tri-tone phase shift mask decreases the intensity of the light of zero order and increases the intensity of light of first order, thereby improving the image contrast. As a result, the resolution of the lithography process and the process margin are increased, thereby improving integration, yield and reliability of the device.

What is claimed is:

1. A phase shift mask, comprising: a transparent substrate having a trench in a guard ring pattern for shifting the phase of light transmitted therethrough by 180°; and a half-tone phase shift pattern disposed on the transparent substrate and surrounded by the guard ring pattern.

2. The phase shift mask according to claim 1, wherein the transparencies of the transparent substrate and the guard ring pattern are 100%, respectively.

3. The phase shift mask according to claim 1, wherein the transparency of the half-tone phase shift pattern ranges from 0 to 25%, and the half-tone phase shift pattern shifts the phase of light transmitted therethrough by 0° or 180°.

* * * * *